(12) United States Patent
Sahba

(10) Patent No.: US 6,403,977 B1
(45) Date of Patent: Jun. 11, 2002

(54) DOUBLE-SIDED HIGH-TEMPERATURE SUPERCONDUCTING FLUX-FLOW TRANSISTOR

(75) Inventor: Shapur Sahba, Ocean, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/882,407

(22) Filed: Jun. 13, 2001

(51) Int. Cl.[7] .......................................... H01L 31/0256
(52) U.S. Cl. .......................................... 257/31; 257/34
(58) Field of Search .............................. 257/31, 30, 9, 257/34–39

(56) References Cited

U.S. PATENT DOCUMENTS 5,338,943 A * 8/1994 Wilber et al. .................. 257/34
5,831,278 A * 11/1998 Berkowitz .................... 257/31

* cited by examiner

Primary Examiner—Hoai V. Ho
Assistant Examiner—Long K. Tran
(74) Attorney, Agent, or Firm—Michael Zelenka; George B. Tereschuk

(57) ABSTRACT

A double-sided high-temperature superconducting flux-flow transistor is provided by advantageously placing a control line assembly and a weak-link assembly on opposite sides of a dielectric substrate to form a double-sided assembly that controls line current on the input side of the substrate that causes generation of vortices on the weak link structure patterned on the substrate's output side. Placing the two assemblies on opposite sides of the same substrate provides the operator with significant modulating capability for applications such as an amplifier or a mixer. Each side of the substrate is patterned and chemically etched to provide a control-line assembly opposed by a weak-link assembly, with the control-line assembly being patterned on the thicker substrate side. In one embodiment, a high-temperature YBCO material is deposited on an LAO dielectric substrate by the thin-film process and both sides of the substrate are patterned and chemically etched to form opposing control-line and weak-link assemblies.

44 Claims, 7 Drawing Sheets

DOUBLE-SIDED HIGH-TEMPERATURE SUPERCONDUCTING FLUX-FLOW TRANSISTOR

GOVERNMENT INTEREST

The invention described herein may be manufactured, used, imported, sold, and licensed by or for the Government of the United States of America without the payment to me of any royalty thereon.

FIELD OF THE INVENTION

The invention generally relates to superconducting flux-flow transistors. In particular, the invention relates to a double-sided high-temperature superconducting flux-flow transistor.

BACKGROUND OF THE INVENTION

Prior art layered transistor structures have been known for some time, and although they offered many advantages in terms of numerous semiconductor applications, they still suffered from a number of disadvantages and shortcomings. One significant limitation with these layered transistor structures is the complex and multi-step layering fabrication process employed. This layering process often required deposition, patterning, a buffer layer and the need to match the superconductor on top of the buffer. Another limitation in prior art transistor structures is the significant difficulties caused by using a number of different materials in the complex multi-step layering process, particularly the fabrication and performance problems caused by varied dielectric constants in the different materials used.

Superconducting flux flow transistors provided several improvements over the prior art layered structures, but still suffered from the long-standing shortcoming of unwanted coupling of input-output signals. The unwanted coupling of input-output signals is associated with three terminal devices, such as the semiconductor and super-conducting flux flow transistors. In order to overcome the long-standing limitations, disadvantages and shortcomings of the layered and three terminal structures and to take advantage of mixed, or vortex state of High-Temperature ceramic superconductors, the present invention provides a double-sided superconducting structure that completely isolates the input and output from each other in separate patterned assembly structures. The advantageous double-sided structure eliminates the unwanted coupling of the input-output signals. In accordance with the present invention, each side of the substrate is patterned and chemically etched to provide a control-line assembly on one side of the structure that is opposed by a weak-link assembly, with the control-line assembly being patterned on the thicker substrate side. By employing this invention's innovative split input-output arrangement, the long-standing drawbacks, limitations and shortcomings of prior art layered structures and three terminal semiconductors have been overcome and resolved.

SUMMARY OF THE INVENTION

It is one object of this invention to provide a split input-output arrangement with a double-sided high-temperature superconducting flux-flow transistor comprising a control line assembly and a weak-link assembly etched on opposite sides of a substrate.

It is another object of this invention to provide a mixer comprising a split input-output arrangement with a double-sided high-temperature superconducting flux-flow transistor comprising a control line assembly and a weak-link assembly etched on opposite sides of a substrate.

To attain these objects and advantages, a double-sided high-temperature superconducting flux-flow transistor is provided, comprising a control line assembly and a weak-link assembly advantageously placed on opposite sides of the substrate to form a double-sided assembly that controls line current on the input side of the substrate that causes generation of vortices on the weak link structure patterned on the substrate's output side. Advantageously placing the two assemblies on opposite sides of the same substrate provides the operator with significant modulating capability for applications such as an amplifier or a mixer. Each side of the substrate is patterned and chemically etched to provide a control-line assembly opposed by a weak-link assembly, with the control-line assembly being patterned on the thicker substrate side. In one embodiment, a high-temperature, yttrium barium copper oxide (YBCO) material is deposited on a lanthanum aluminum oxide (LAO) dielectric substrate by the thin-film process and both sides of the substrate are patterned and chemically etched to form opposing control-line and weak-link assemblies. In this arrangement, the control-line assembly is patterned on the thicker input side, having a thickness of about 3000 Å that is above the penetration depth of the superconducting material. The weak-link assembly is patterned on the thinner output film side, which at about 2000 Å thick is thinner than the penetration depth of the superconducting material. The penetration depth of any particular material will vary according to that material's properties, but in any event, the weak-link assembly will always be thinner than the penetration depth.

These and other features of the invention will become more apparent from the Detailed Description and the drawings. The scope of the invention, however, is limited only by the claims.

DETAILED DESCRIPTION OF THE INVENTION

Figure 1:
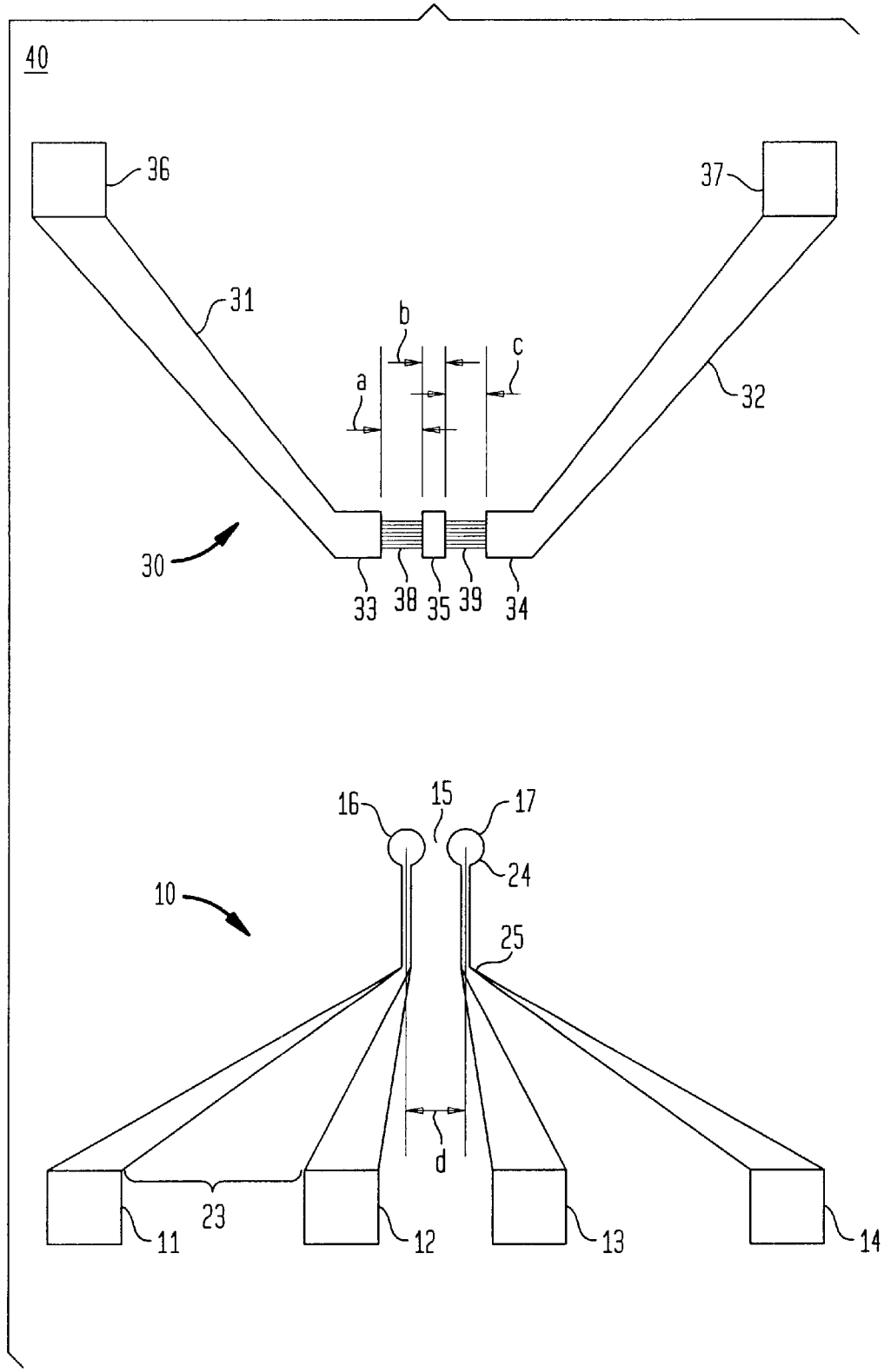
FIG. 1 is a top partial cutaway view of the weak-link means and the control-line means of the double-sided high-temperature superconducting flux-flow transistor of the present invention.
Figure 2A:
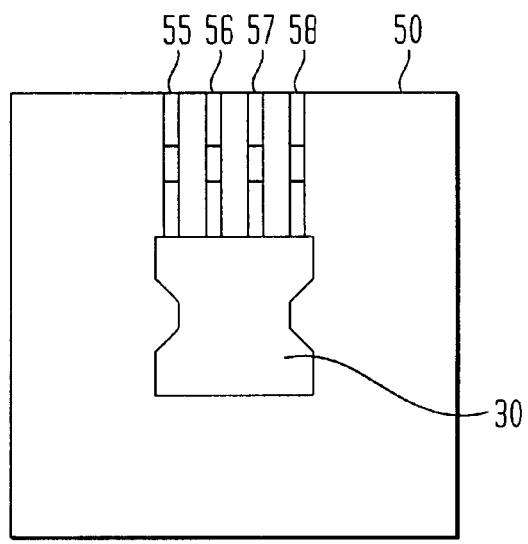
FIGS. 2A and 2B are top partial cutaway views of the weak-link means etched on the output side of the substrate and an obverse view of substrate with the control-line means etched on the input side of substrate of the double-sided high-temperature superconducting flux-flow transistor of the present invention.
Figure 2B:
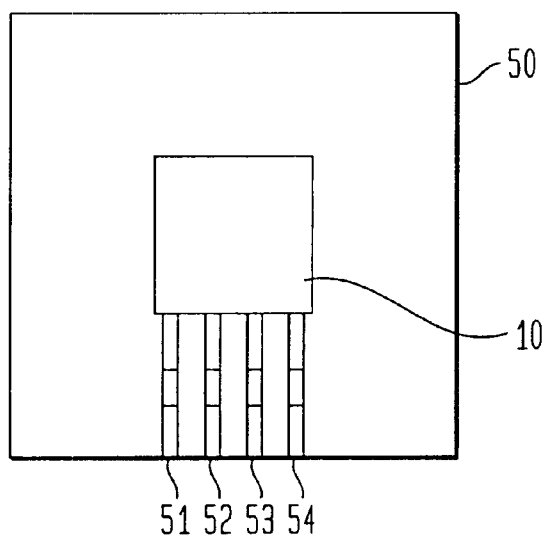

Referring now to FIG. 1, which is a top and partial cut-away view of the double-sided high-temperature superconducting flux-flow transistor 40 of the present invention comprising a weak-link assembly means 30 and a means for control-line current 10, which oppose each other point to point and are disposed on opposite sides of a substrate, not shown in this drawing. FIG. 2A depicts a top view of weak-link means 30 etched on the output side of substrate 50 and FIG. 2B depicts an obverse view of substrate 50 with the control-line means 10 etched on the input side of substrate 50. In operation, the modulation weak-link means 30 and control-line means 10 advantageously disposed on opposing sides of substrate 50 form a double-sided assembly to control line current on the input side of the substrate causing generation of vortices on the weak link structure 30 patterned on substrate's 50 opposing output side.

Referring back to FIG. 1, the control-line means further comprises a plurality of AC input contact points 11, 12, 13 and 14, which are connection points for the AC input. Contact points 12 and 13 are separated by a gap 15. Contact points 11 and 12 are connected to an inductor 16 and contact points 13 and 14 are connected to an inductor 17. Input electrodes 11–14 taper narrowly near inductors 16 and 17, and then widen outwardly approaching the opposite ends of contact points 11–14. In this configuration with both inductors 16 and 17, the device functions as a mixer. However, it is also within the contemplation of this invention to have only one inductor for an amplifier, a greater number of input contact points and a plurality of inductors for other applications. One of the key advantages of this invention's double-sided high-temperature superconducting flux-flow transistor 40 is the ability to connect numerous for a single output, which permits mixing several signals at the same time. The width of gap 15, represented by dimension d, is important to provide for the proper spacing of inductors 16 and 17 to interact with portions of the weak-link means 30. In one embodiment, the control line assembly means 10 is composed of a high-temperature YBCO material deposited on an LAO dielectric substrate 50 by a thin-film process with the input and output sides of the LAO substrate 50 being patterned and chemically etched.

The weak-link means 30 comprises a plurality of DC output contact points 31 and 32, which are connected to a first weak-link 38, a central point 35 and a second weak-link 39, allowing DC current to pass through the device. DC output contact points 31 and 32 are also connected at ends 36 and 37, respectively, to any piece of electronics or communications equipment that could benefit from being connected to an active super-conducting device, such as a super computer. Contact points 31 and 32 taper narrowly at the ends, which connect to the first weak link 38 and second weak link 39 and then widen outward gradually to become somewhat thicker at ends 36 and 37. For the sake of clarity, FIG. 1 shows an exaggerated space between the control line means 10 and the weak link means 30, however, in operation, the control line means 10 and the weak-link means 30 are disposed point-to-point with the first and second inductors 16 and 17, respectively, overlapping the first and second weak links, respectively. Moreover, it is important that the diameter of a given inductor be equivalent to the length of its corresponding weak-link. Further, it is significant that the first weak link 38 and the second weak link 39 have different widths, and preferably the second weak link 39 is somewhat longer than the first weak link 38. The width of first weak link 38 is represented by dimension a, and the width of the second weak link 39 is represented by dimension c, with a<c. The width of gap 15 is represented by dimension c, which is 300 microns.

The significance of these dimensions is that the widths of the weak-links will determine the frequency response of the active device, so that very short widths will result in a frequency of a few GigaHertz's and longer widths result in much higher frequencies. In one embodiment, the weak-link means 30 is also composed of a high-temperature YBCO material deposited on an LAO dielectric substrate 50 by a thin-film process. Thus the either the control line means or the weak-link means can be composed of YBCO, or both may be composed of YBCO. Additionally, other suitable materials can also be advantageously employed in accordance with the present invention.

Referring back to FIG. 2A, the weak-link means 30 is shown etched on the output side of substrate 50 and FIG. 2B depicts an obverse view of substrate 50 with the control-line means 10 etched on the input side of substrate 50. FIG. 2B depicts output terminals 55–58 on the output side of substrate 50 which can be connected to the ends 36 and 37 depicted in FIG. 1. FIG. 2B shows the input terminals 51–54 on the input side of substrate 50 can be connected to the contact points 11–14 of the control line means 10 depicted in FIG. 1. Substrate 50 can be transparent and in the preferred embodiment is an LAO dielectric substrate.

Figure 3A:
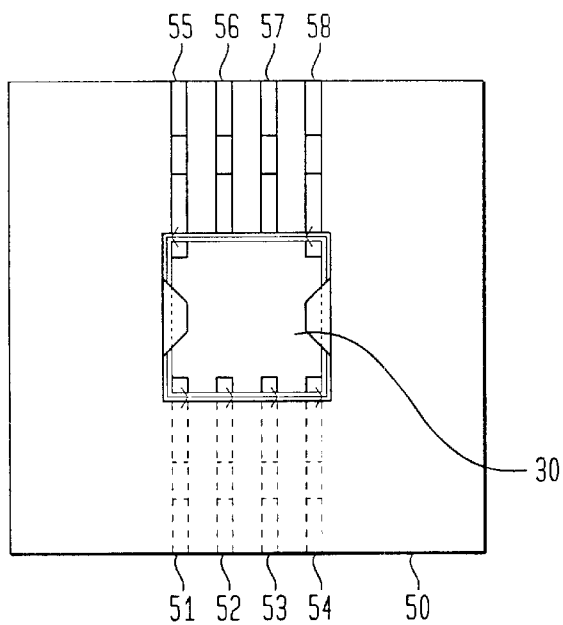
FIGS. 3A–3D are top, bottom side and perspective views of the double-sided high-temperature superconducting flux-flow transistor of the present invention mounted in an outer package assembly.
Figure 3C:
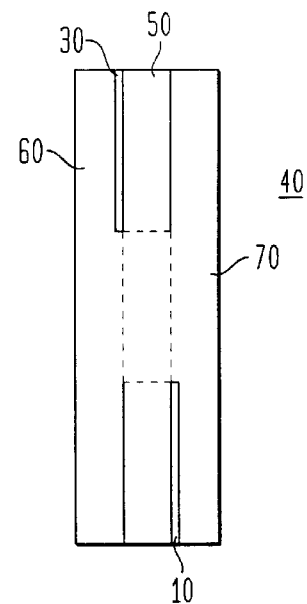
Figure 3B:
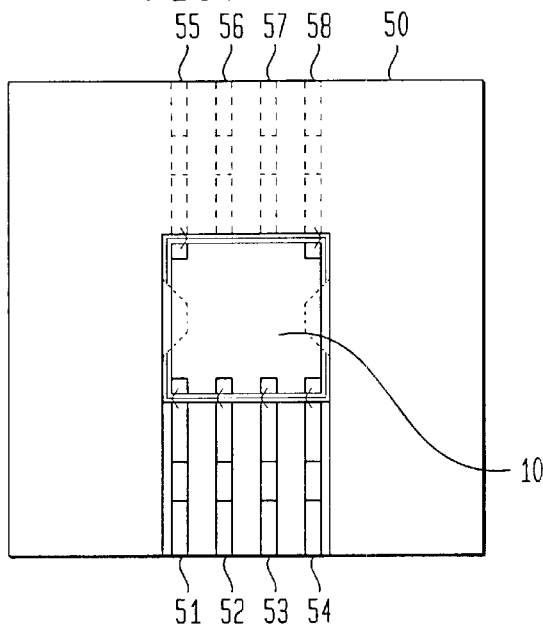
Figure 3D:
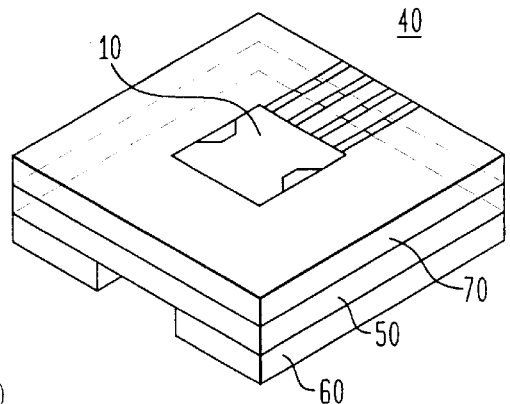

Referring now to FIGS. 3A–3D, FIG. 3A is a top partial cut-away view of the output side of substrate 50 showing the weak-link means 30 etched thereon, output terminals 55–58 and broken lines 51–54 which represent input terminals 51–54 on the opposite input side of substrate 50. FIG. 3B is a top partial cut-away view of the input side of substrate 50 with the control line means 10 etched thereon, input terminals 51–54 and broken lines 55–58 to represent output terminals 55–58 on the opposite output side of substrate 50. FIG. 3C is a side cut-away view of the double-sided high-temperature superconducting flux-flow transistor 40 of the present invention depicting outer package members 60 and 70, respectively, sandwiched around substrate 50 with the control line means 10 disposed on the input side of substrate 50 and weak-link means 30 disposed on the output side of substrate 50. FIG. 3D is perspective partial cut-away view depicting outer package member 70 stacked on substrate 50 with the control line means 10 disposed on the input side of substrate 50 and substrate 50 stacked on outer package member 60, with the broken lines indicating the edges of the outer package member 60 and substrate 50. The outer package members 60 and 70 can be composed of aluminum oxide or any other compatible material that can be easily soldered.

Figure 4:
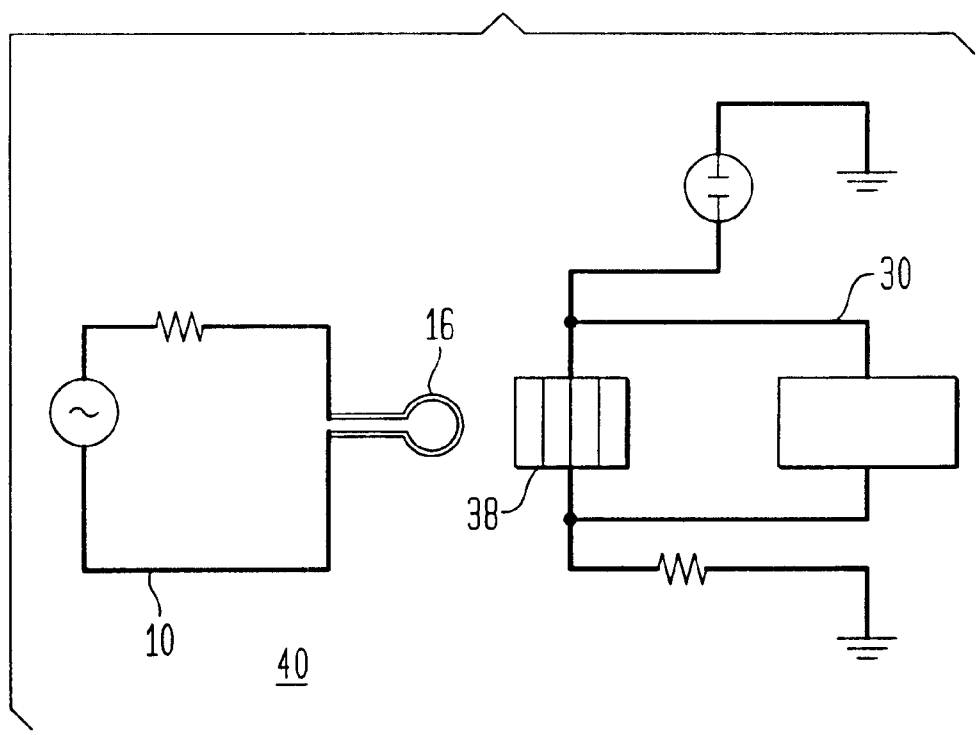
FIG. 4 is a schematic diagram of depicting the operation of the weak-link means and the control line means of the double-sided high-temperature superconducting flux-flow transistor of the present invention.

FIG. 4 is a schematic diagram depicting the interaction and operation of the weak-link means 30 and the control line means 10 of the double-sided high-temperature superconducting flux-flow transistor 40 of the present invention, employing like numerals for common structural elements. For the sake of clarity, only a single inductor loop 16 and its opposing weak-link 38 are depicted. In accordance with the present invention, inductor 16 creates a magnetic field, extending upward from the page, that produces cylindrical vortices within the weak-link 38. As the strength of the magnetic field produced by the inductor increases, a greater number of cylindrical vortices are formed, which, according to Lawrence's Force Law, results in superconductivity outside of the cylindrical vortices formed on weak-link 38. Additionally, changing the polarity of inductor 16 also changes the polarity of the cylindrical vortices so that signal mixing can occur if two or more sets of inductors and weak-links are used.

This invention's double-sided high-temperature superconductive flux-flow transistor 40 is an active device taking advantage of mixed, or vortex state of high-temperature ceramic superconductors. In the preferred embodiment, a single LAO dielectric substrate provides the base for the device on both sides of this substrate, and by the thin-film process, high-temperature YBCO material is deposited. Then both sides of the substrate are patterned and chemically etched to form the control-line means 10 and weak-link means 30, with the control-line means 10 being patterned on the input side at a thickness of about 3000 Å, which is above the penetration depth of the YBCO superconducting material employed in the preferred embodiment. The weak-link means 30 is also patterned on the output side with a thinner layer of film, at about 2000 Å, that is just below the penetration depth of the YBCO high-temperature superconducting material. In accordance with this invention, the control-line means 10 needs to be patterned with a film thicker than the penetration depth of the superconducting material and the weak-link means 30 needs to be patterned with a film that is thinner than the penetration depth of that material. Those skilled in the art will readily appreciate that the penetration depth of given superconducting materials will vary according to the selected material's properties.

The double-sided high-temperature super conductive flux-flow transistor 40 of the present invention depicted in the FIG. 4 schematic diagram can provide a clear flux-flow regime for an input current of 4.21 mA, with AC frequencies of about 10 MHz, a weak link DC current of about 85–100 mA and an output voltage 6–11.5 mVolts, AC with frequencies of about 10 MHz. The present invention obtains remarkable flux flow resistivity in accordance with the following formula:

$$\rho_{ff}/\rho_0 = \{1 + [2\pi r\, H_{c2}/I_{control}][\exp(-I_{control}/(2\pi r\, H_{c2}))]\}^{-1},$$

where r is the radius of the control-line loop 16 or 17, $I_{control}$ is the the Control-Line current, always less than the critical current, $I_{control} \leq I_{critical}$, $H_{c2}$ is the upper-limit of the critical applied magnetic field (Type-II and HTS materials) and $\rho_0$ is the normal-state resistivity at the onset of the transition temperature. In this formula, $I_{control}$, at some places has been shown as $I_c$, which should not be mistaken with the critical current, which is a characteristic parameter of the superconductors. Therefore, $I_{control}$ is specified to avoid any possible confusion.

Figure 5:
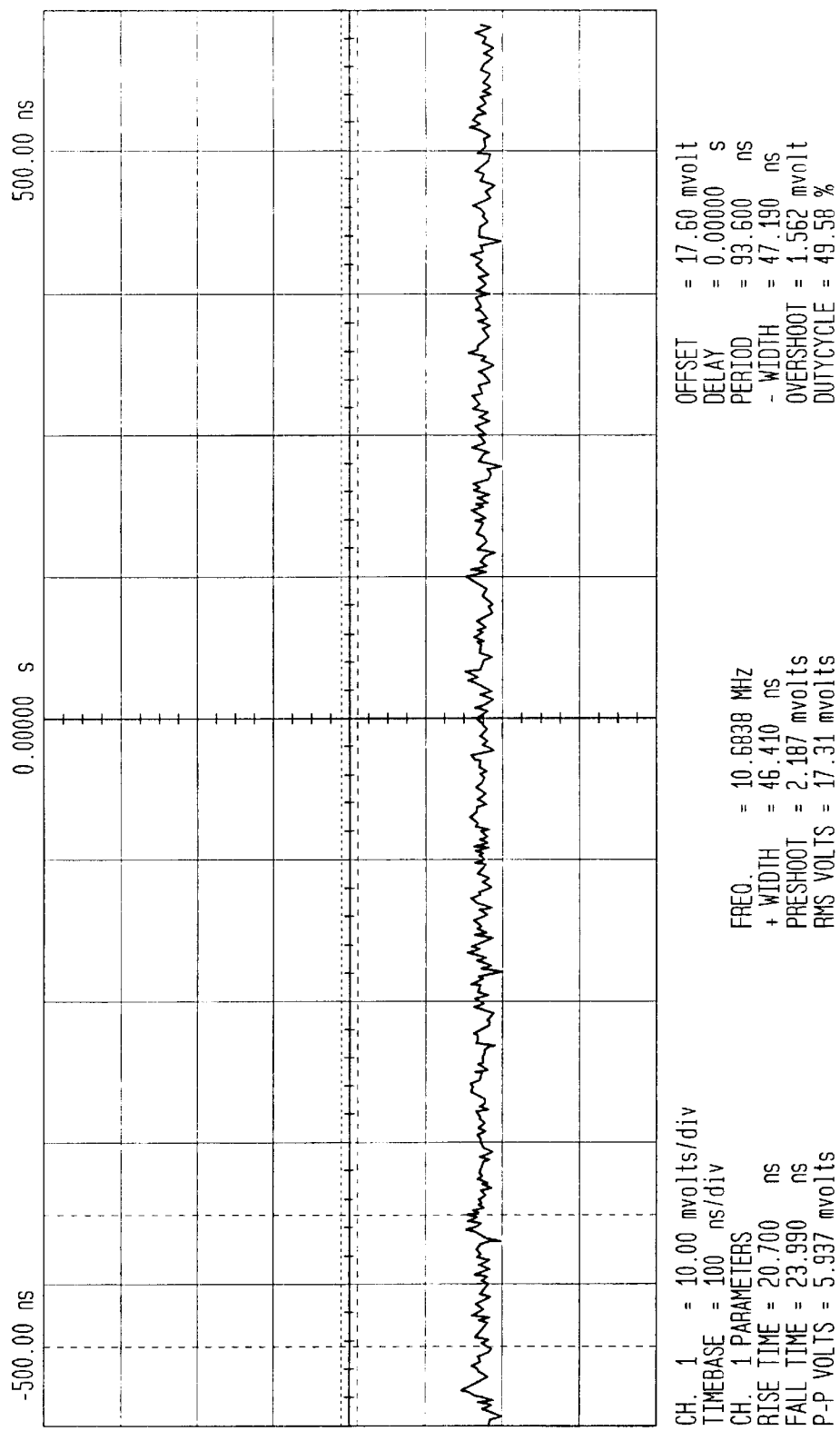
FIG. 5 is a graph depicting no modulation AC characterizations results of the double-sided high-temperature superconducting flux-flow transistor of the present invention where $I_{dc}=0$.
Figure 6:
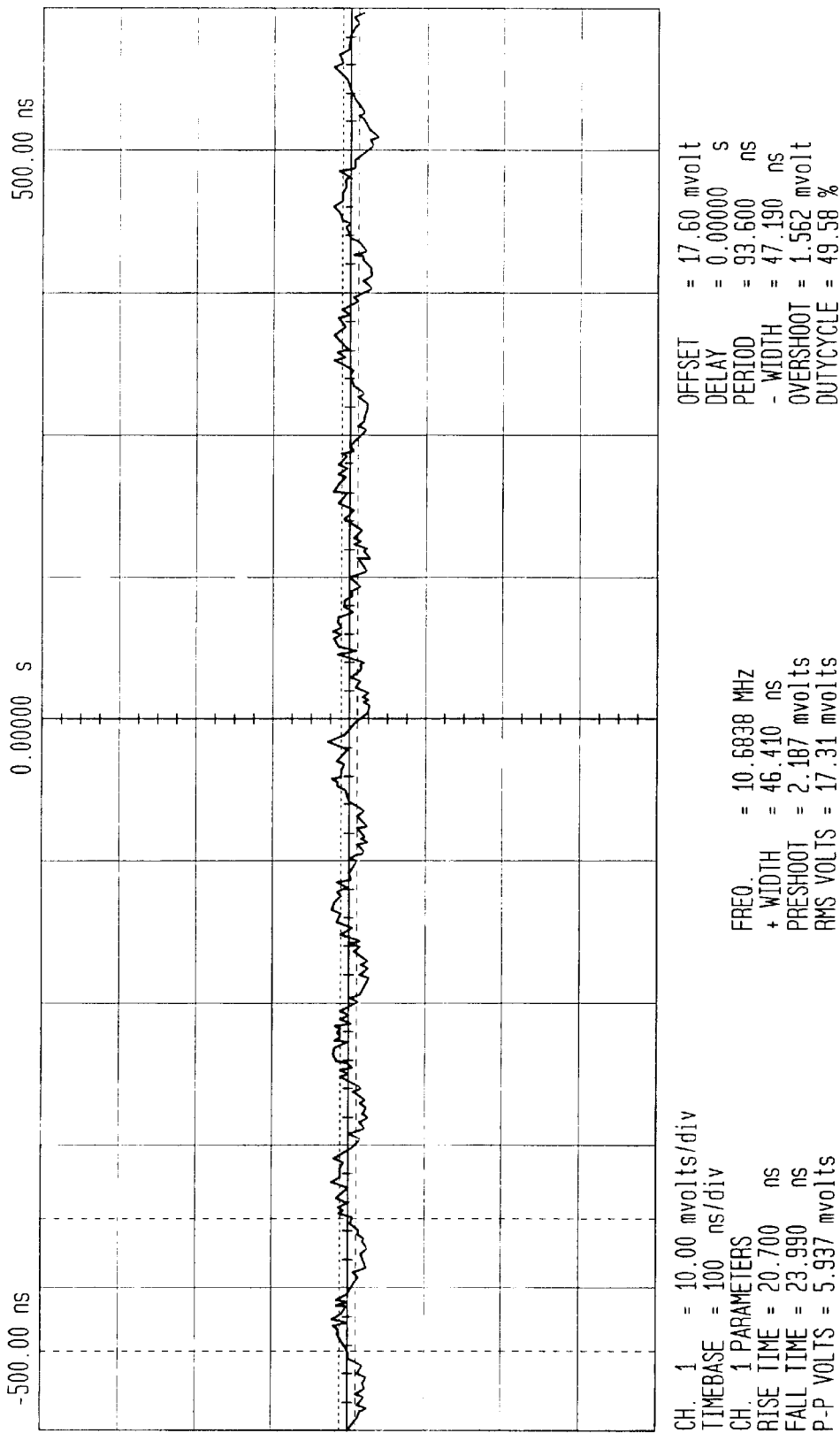
FIG. 6 is a graph depicting frequency modulation AC characterizations results of double-sided high-temperature superconducting flux-flow transistor of the present invention where $I_{dc}=80$ mA.
Figure 7:
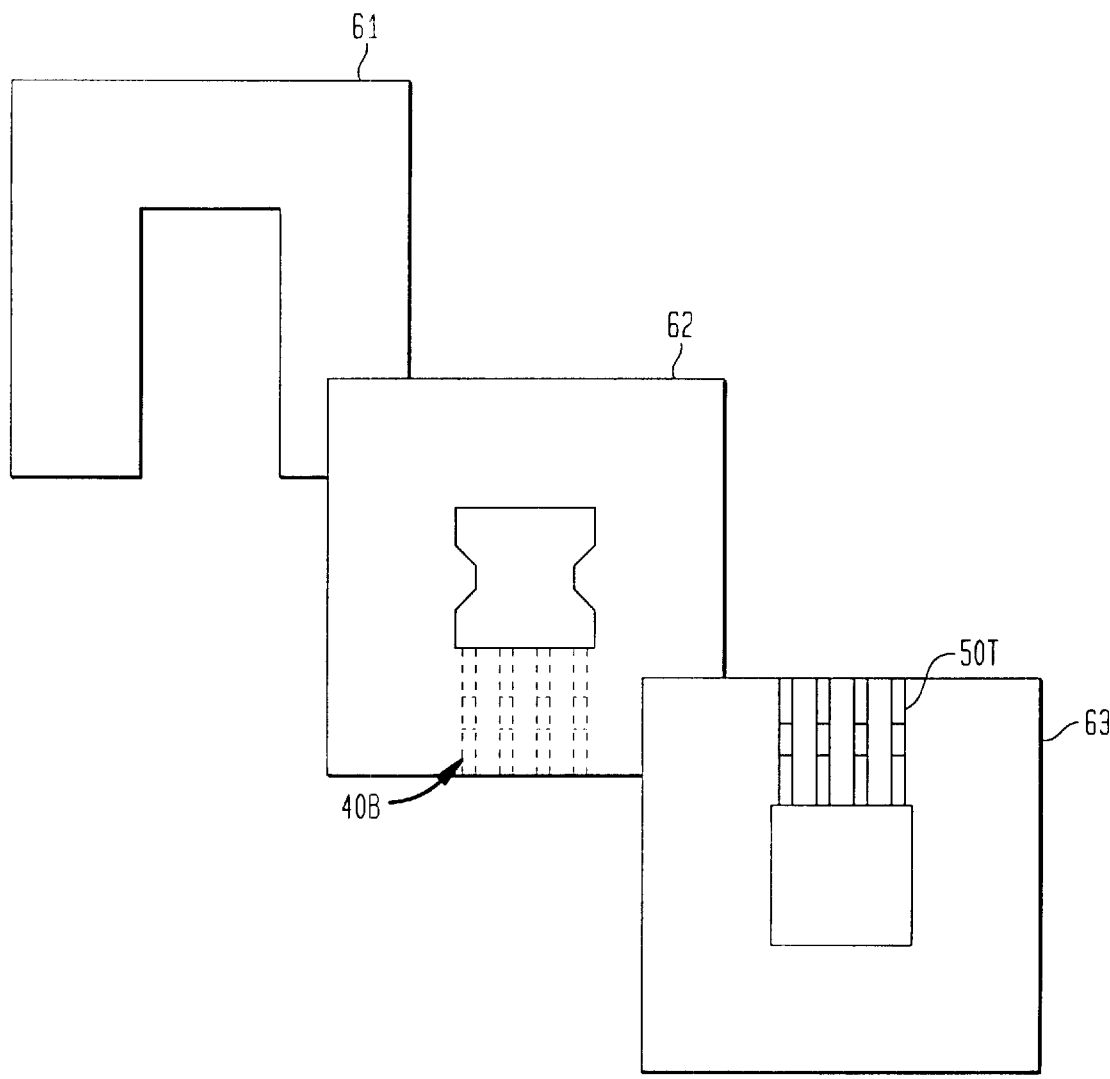
FIG. 7 depicts the substrate, a top view and a bottom view of the outer package of the double-sided high-temperature superconducting flux-flow transistor of the present invention.

FIG. 5 is a graph depicting no modulation AC characterizations results of the double-sided high-temperature super conducting flux-flow transistor of the present invention where $I_{dc}=0$. FIG. 6 is a graph depicting frequency modulation AC characterizations results of double-sided high-temperature superconducting flux-flow transistor of the present invention in operation where $I_{dc}=80$ mA.

The present invention also contemplates a number of other variations, modifications and applications. The drawings depict a double control loop configuration to operate as a mixer, but a single control loop may also be advantageously employed as an amplifier. Similarly, applications such as A/D converters, active HTS Filters, and so forth are also within the contemplation of this invention.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, stacking arrangements and dimensions can achieve the results described herein, without departing from the spirit and scope of this invention. Accordingly, the present invention should not be limited by the foregoing description, but only by the appended claims.

I claim:

1. A double-sided high-temperature superconducting flux-flow transistor, comprising:
    a means for controlling line current composed of a first high temperature superconducting material is deposited on an input side of a dielectric substrate;
    a means for weak-link current composed of a second high temperature superconducting material is deposited on an output side of said dielectric substrate;
    said control line means being thicker than said weak link means;
    said control line means having a plurality of AC input contact points, said plurality of AC contact points forming a plurality of inductors;
    said weak-link means having at least two DC contact points having opposing longitudinal weak-link segments connected at a central point, with a first of said longitudinal segments being shorter than a second of said longitudinal segments;
    each of said plurality of inductors overlapping one of said weak-link segments;
    said plurality of inductors creating a magnetic field producing a group of cylindrical vortices within said weak-link segments; and
    said group of cylindrical vortices producing a frequency modulation and an RF characterization resulting in a clear flux-flow and a modulating frequency.

2. The double-sided high-temperature superconducting flux-flow transistor, as recited in claim 1, further comprising said group of cylindrical vortices producing said frequency modulation in the presence of said magnetic field.

3. The double-sided high-temperature superconducting flux-flow transistor, as recited in claim 2, further comprising said control line means opposing said weak-link means.

4. The double-sided high-temperature superconducting flux-flow transistor, as recited in claim 3, wherein increasing the magnitude of said magnetic field provides a larger group of cylindrical vortices.

5. The double-sided high-temperature superconducting flux-flow transistor, as recited in claim 4, further comprising said larger group of cylindrical vortices creates a superconductivity region outside of said cylindrical vortices.

6. The double-sided high-temperature superconducting flux-flow transistor, as recited in claim 5, further comprising said control line means being thicker than a penetration depth of said superconducting material.

7. The double-sided high-temperature superconducting flux-flow transistor, as recited in claim 6, further comprising said weak-link means being thinner than said penetration depth.

8. The double-sided high-temperature superconducting flux-flow transistor, as recited in claim 7, further comprising said control line means being patterned on said input side.

9. The double-sided high-temperature superconducting flux-flow transistor, as recited in claim 5, further comprising said weak-link means being patterned on said output side.

10. The double-sided high-temperature superconducting flux-flow transistor, as recited in claim 9, further comprising said first high-temperature superconducting material is YBCO.

11. The double-sided high-temperature superconducting flux-flow transistor, as recited in claim 10, further comprising said dielectric substrate is composed of LAO.

12. The double-sided high-temperature superconducting flux-flow transistor, as recited in claim 11, further comprising said second high-temperature superconducting material is YBCO.

13. The double-sided high-temperature superconducting flux-flow transistor, as recited in claim 12, further comprising said input side having a thickness of about 3000 Å.

14. The double-sided high-temperature superconducting flux-flow transistor, as recited in claim 13, further comprising said output side having a thickness of about 2000 Å.

15. The double-sided high-temperature superconducting flux-flow transistor, as recited in claim 14, wherein the transistor functions as an amplifier.

16. The double-sided high-temperature superconducting flux-flow transistor, as recited in claim 14, wherein:
    said plurality of inductors being at least two sets of inductors;
    a polarity change to one of said two sets of inductors; and
    the transistor provides signal mixing.

17. A double-sided high-temperature superconducting flux-flow transistor for a mixer, comprising:
    a means for controlling line current composed of a first high temperature superconducting material is deposited on an input side of a dielectric substrate;
    a means for weak-link current composed of a second high temperature superconducting material is deposited on an output side of said dielectric substrate;
    said control line means being thicker than said weak link means;
    said control line means having a plurality of AC input contact points, said plurality of AC contact points forming at least two inductors;
    said weak-link means having at least two DC contact points having opposing longitudinal weak-link segments connected at a central point, with a first of said longitudinal segments being shorter than a second of said longitudinal segments;
    each of said plurality of inductors overlapping one of said weak-link segments;
    said plurality of inductors creating a magnetic field producing a group of cylindrical vortices within said weak-link segments; and
    said group of cylindrical vortices producing a frequency modulation and an RF characterization resulting in a clear flux-flow and a modulating frequency.

18. The double-sided high-temperature superconducting flux-flow transistor for said mixer, as recited in claim 17, further comprising said group of cylindrical vortices producing said frequency modulation in the presence of said magnetic field.

19. The double-sided high-temperature superconducting flux-flow transistor for said mixer, as recited in claim 18, further comprising said control line means opposing said weak-link means.

20. The double-sided high-temperature superconducting flux-flow transistor for said mixer, as recited in claim 19, wherein increasing the magnitude of said magnetic field provides a larger group of cylindrical vortices.

21. The double-sided high-temperature superconducting flux-flow transistor for said mixer, as recited in claim 20, further comprising said larger group of cylindrical vortices creates a superconductivity region outside of said cylindrical vortices.

22. The double-sided high-temperature superconducting flux-flow transistor for said mixer, as recited in claim 21, further comprising said control line means being thicker than a penetration depth of said superconducting material.

23. The double-sided high-temperature superconducting flux-flow transistor for said mixer, as recited in claim 22, further comprising said weak-link means being thinner than said penetration depth.

24. The double-sided high-temperature superconducting flux-flow transistor for said mixer, as recited in claim 23, further comprising said control line means being patterned on said input side.

25. The double-sided high-temperature superconducting flux-flow transistor for said mixer, as recited in claim 24, further comprising said weak-link means being patterned on said output side.

26. The double-sided high-temperature superconducting flux-flow transistor for said mixer, as recited in claim 25, further comprising said first high-temperature superconducting material is YBCO.

27. The double-sided high-temperature superconducting flux-flow transistor for said mixer, as recited in claim 26, further comprising said dielectric substrate is composed of LAO.

28. The double-sided high-temperature superconducting flux-flow transistor for said mixer, as recited in claim 27, further comprising said second high-temperature superconducting material is YBCO.

29. The double-sided high-temperature superconducting flux-flow transistor for said mixer, as recited in claim 28, further comprising said input side having a thickness of about 3000 Å.

30. A double-sided high-temperature superconducting flux-flow transistor for said mixer, as recited in claim 29, further comprising said output side having a thickness of about 2000 Å.

31. A double-sided high-temperature superconducting flux-flow transistor for an amplifier, comprising:
    a means for controlling line current composed of a first high temperature superconducting material is deposited on an input side of a dielectric substrate;
    a means for weak-link current composed of a second high temperature superconducting material is deposited on an output side of said dielectric substrate;
    said control line means being thicker than said weak link means;
    said control line means having a plurality of AC input contact points, said plurality of AC contact points forming a plurality of inductors;
    said weak-link means having at least two DC contact points having opposing longitudinal weak-link segments connected at a central point, with a first of said longitudinal segments being shorter than a second of said longitudinal segments;
    each of said plurality of inductors overlapping one of said weak-link segments;
    said plurality of inductors creating a magnetic field producing a group of cylindrical vortices within said weak-link segments; and
    said group of cylindrical vortices producing a frequency modulation and an RF characterization resulting in a clear flux-flow and a modulating frequency.

32. The double-sided high-temperature superconducting flux-flow transistor for said amplifier, as recited in claim 31, further comprising said group of cylindrical vortices producing said frequency modulation in the presence of said magnetic field.

33. The double-sided high-temperature superconducting flux-flow transistor for said amplifier, as recited in claim 32, further comprising said control line means opposing said weak-link means.

34. The double-sided high-temperature superconducting flux-flow transistor for said amplifier, as recited in claim 33, further comprising an increasing strength of said magnetic field provides a larger group of cylindrical vortices.

35. The double-sided high-temperature superconducting flux-flow transistor for said amplifier, as recited in claim 34, further comprising said larger group of cylindrical vortices creates a superconductivity region outside of said cylindrical vortices.

36. The double-sided high-temperature superconducting flux-flow transistor for said amplifier, as recited in claim 35, further comprising said control line means being thicker than a penetration depth of said superconducting material.

37. The double-sided high-temperature superconducting flux-flow transistor for said amplifier, as recited in claim 36, further comprising said weak-link means being thinner than said penetration depth.

38. The double-sided high-temperature superconducting flux-flow transistor for said amplifier, as recited in claim 37, further comprising said control line means being patterned on said input side.

39. The double-sided high-temperature superconducting flux-flow transistor for said amplifier, as recited in claim 35, further comprising said weak-link means being patterned on said output side.

40. The double-sided high-temperature superconducting flux-flow transistor for said amplifier, as recited in claim 39, further comprising said first high-temperature superconducting material is YBCO.

41. The double-sided high-temperature superconducting flux-flow transistor for said amplifier, as recited in claim 40, further comprising said dielectric substrate is composed of LAO.

42. The double-sided high-temperature superconducting flux-flow transistor for said amplifier, as recited in claim 41, further comprising said second high-temperature superconducting material is YBCO.

43. The double-sided high-temperature superconducting flux-flow transistor for said amplifier, as recited in claim 42, further comprising said input side having a thickness of about 3000 Å.

44. The double-sided high-temperature superconducting flux-flow transistor for said amplifier, as recited in claim 43, further comprising said output side having a thickness of about 2000 Å.

\* \* \* \* \*